United States Patent [19]

Mollett et al.

[11] Patent Number: 4,691,173

[45] Date of Patent: Sep. 1, 1987

[54] RF INPUT DRIVE SATURATION CONTROL LOOP

[75] Inventors: Larry R. Mollett, Fullerton, Calif.; Robert W. Goczalk, Acton, Mass.

[73] Assignee: Hughes Aircraft Company, Los Angeles, Calif.

[21] Appl. No.: 945,250

[22] Filed: Dec. 22, 1986

Related U.S. Application Data

[63] Continuation of Ser. No. 740,092, May 31, 1985, abandoned.

[51] Int. Cl.⁴ .............................................. H03F 7/00
[52] U.S. Cl. ..................................... 330/144; 330/4.6
[58] Field of Search ................................. 330/4.6, 144

[56] References Cited

U.S. PATENT DOCUMENTS 3,398,361 8/1968 Prestwood .......................... 330/4.6
4,066,965 1/1978 Schultz ................................ 325/120

FOREIGN PATENT DOCUMENTS 8400237 10/1984 PCT Int'l Appl. .
2060292 4/1981 United Kingdom .

OTHER PUBLICATIONS

Rundfunktechn.Mitteilungen, vol. 24, No. 1, Jan. 1980 (Hamburg, DE), W. Hofer: "Entwicklung eines Sendebegrenzers in PCM-Technik", pp. 19-25.

International Search Report for PD84037P—PCT Appl. No. PCT/US86/01126.

*Primary Examiner*—Gene Wan
*Attorney, Agent, or Firm*—Thomas A. Runk; Anthony W. Karambelas

[57] ABSTRACT

A system for optimizing the RF input drive to a TWT amplifier over a frequency band of interest is disclosed. The system includes a microprocessor-based controller, an RF detector for detecting the TWT output, and a variable attenuator for adjusting the input drive to the TWT. The controller comprises an analog-to-digital converter for converting the video detector signals and providing digital RF level signals which are representative of the TWT output power level. Frequency data is also provided to the controller indicating the frequency of the RF exciter signals driving the TWT. The controller is, therefore, provided with frequency and RF level information, and is adapted to control the attenuator to adjust the TWT input drive for optimum TWT output. The system is operable in a calibration mode wherein the controller follows a calibration algorithm to determine the optimum attenuator setting, resulting in the maximum RF output, for each frequency of interest. The optimum attenuator setting is stored in an EEPROM for each drive frequency. The system is further operable in a normal mode wherein the controller sets the attenuator at the predetermined optimum setting for the present exciter frequency.

17 Claims, 7 Drawing Figures

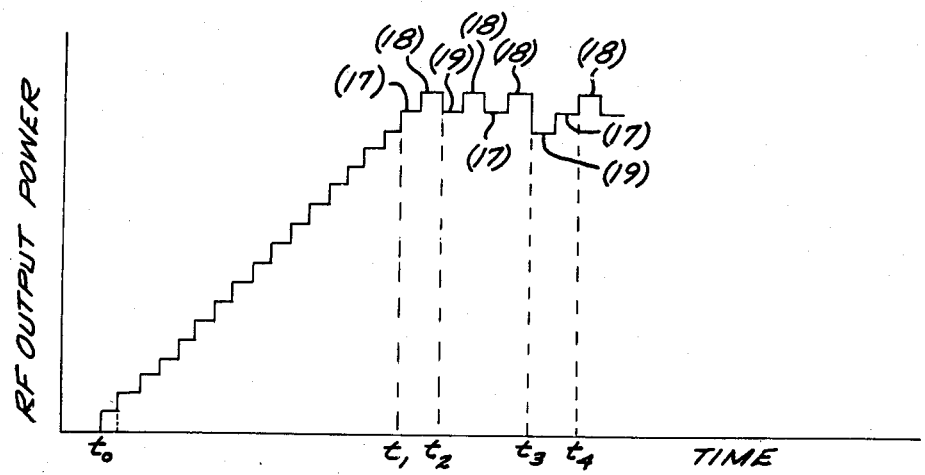
FIG. 5
FIG. 6
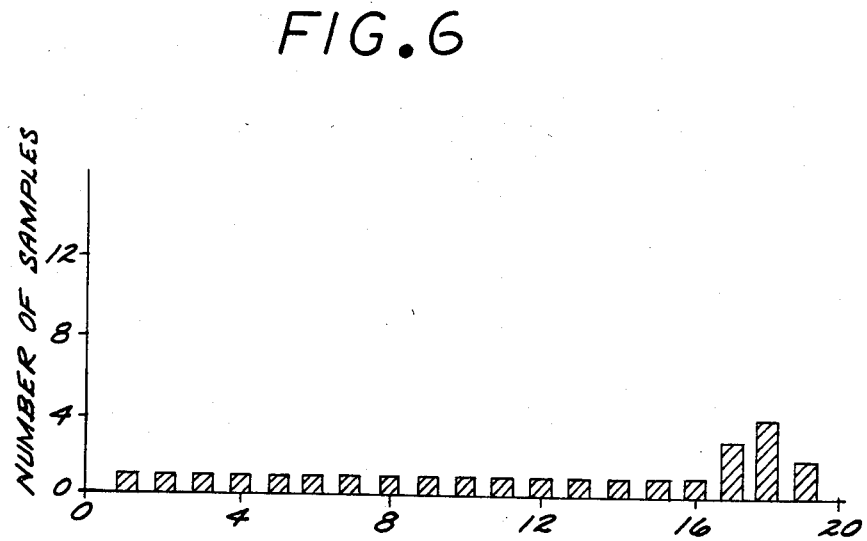

RF INPUT DRIVE SATURATION CONTROL LOOP

The Government has rights to this invention pursuant to Contract No. DAAK20-81-C-0390 awarded by the Department of the Army.

This application is a continuation of application Ser. No. 06/740,092 filed May 31, 1985.

BACKGROUND OF THE INVENTION

The present invention relates to control of the input drive level to traveling wave tube (TWT) amplifiers, and more particularly to improved techniques for optimizing TWT efficiency over a range of operating frequencies.

TWT amplifiers are in wide use in a variety of applications in which amplification of RF energy is required. Limitations imposed by TWT characteristics and manufacturing techniques result in a frequency-dependent input RF drive characteristic. These limitations can result in significant variations even between tubes of the same manufacturer and within the same manufacturing sequence. An optimum drive level for a given frequency will yield a maximum RF output power. Beyond that optimum drive level, defocusing and marked reduction of beam current transmission and TWT efficiency occurs. This results in increased power dissipation in the TWT RF structure and a decreased RF output power.

Insofar as applicants are aware, in the past, fixed, frequency dependent RF attenuators or gain equalizers tuned for each TWT amplifier have been employed to provide the optimum input RF drive level to the TWT. An alternative is to provide means for flattening the TWT amplifier gain and RF input driver characteristics for the frequencies used. Both alternatives are relatively expensive and are affected by the performance degradation of the amplifier during its operating life.

It would therefore be an advance in the art to provide an automated system for optimizing the RF drive level to a TWT amplifier, which provides an optimum RF drive for each frequency of concern, and allows for recalibration of the optimum RF drive as desired to compensate for aging of the TWT amplifier or other microwave chain components.

SUMMARY OF THE INVENTION

A system for optimizing the input RF drive to a TWT RF amplifier is disclosed. The system comprises a programmable attenuator for selectively controlling the input drive level to the TWT, an RF detector for monitoring the output power level of the TWT, and a controller. The controller receives detector signals representative of the RF detector output and frequency signals representative of the RF exciter frequency to the TWT amplifier, and provides attenuator control signals to the programmable attenuator. The system is operable in a calibration mode, wherein for each exciter frequency of interest, the attenuator setting resulting in the maximum TWT output power is determined. These attenuator settings are then stored in memory, and are available for recall during the normal operating mode. In the normal mode, the system automatically sets the RF input drive at the optimum level, by setting the programmable attenuator to the predetermined setting corresponding to the present exciter frequency. The calibration mode may be rapidly repeated over the life of the TWT amplifier to accommodate changing characteristics as the elements of the TWT amplifier age or change due to other factors.

BRIEF DESCRIPTION OF THE DRAWINGS

These and other features and advantages of the present invention will become more apparent from the following detailed description of an exemplary embodiment thereof, as illustrated in the accompanying drawings, in which:

FIG. 5 is a plot of the TWT output power as a function of time, in which the digital attenuator employed in the preferred embodiment is progressively programmed to particular settings, illustrating the dynamic calibration process at a particular frequency.

FIG. 6 is a histogram of the number of samples for each attenuator setting counted during the dynamic calibration shown in FIG. 5.

DETAILED DESCRIPTION OF THE PREFERRED EMBODIMENT

The present invention comprises a system for optimizing the RF input drive to a TWT amplifier. The following description is presented to enable a person skilled in the art to make and use the invention, and is provided in the context of a particular application and its requirements. Various modifications to the preferred embodiment may be apparent to those skilled in the art, however, and the present invention is not intended to be limited to the embodiment show, but is intended to be accorded the widest scope consistent with the principles and novel features disclosed herein.

Figure 1:
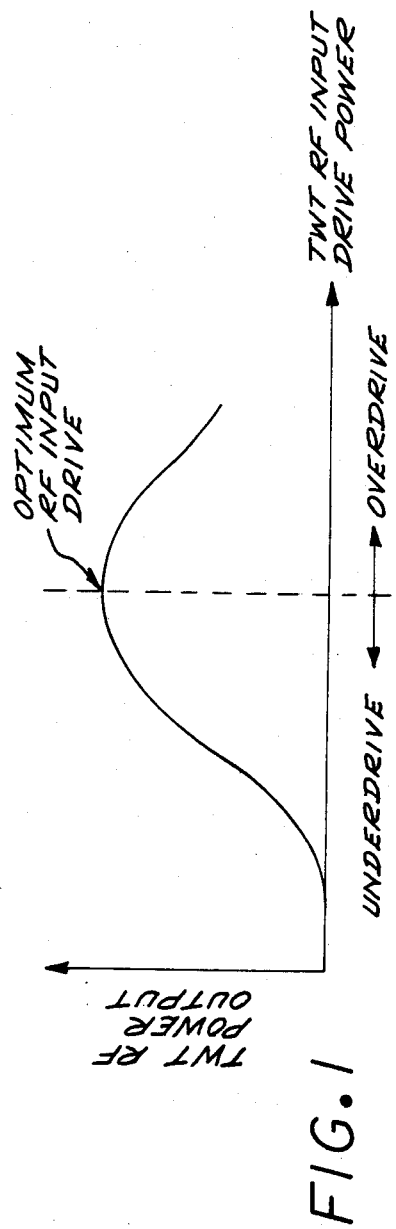
FIG. 1 is a graph representing a typical TWT output power saturation curve.

FIG. 1 represents a typical saturation curve for a TWT amplifier. The output power of the TWT is plotted as a function of the RF input drive power. It is seen that there is one optimum input drive power level which can result in maximum output power. When the TWT is overdriven, the output power is not only reduced, but the TWT operates in a less efficient mode.

Figure 2:
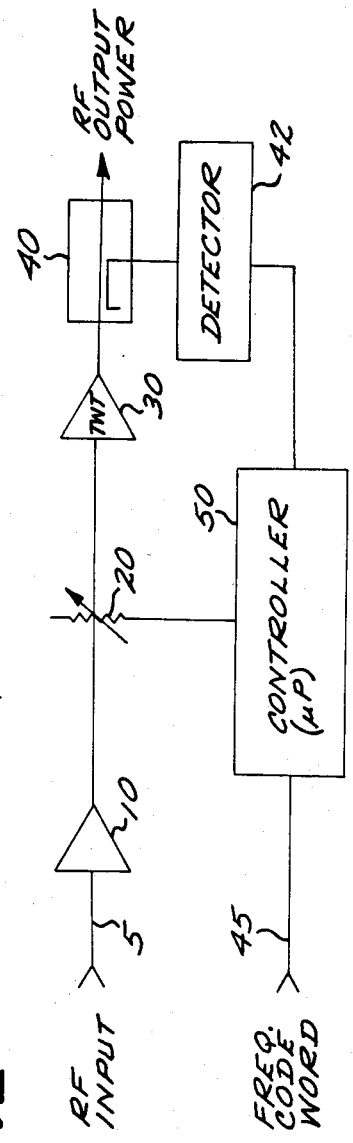
FIG. 2 is a simplified block diagram comprising the presently preferred embodiment of the invention.

The preferred embodiment comprises a system for automatically adjusting the input drive level to a TWT amplifier as a function of the input RF drive frequency. A simplified block diagram is illustrated in FIG. 2. The RF exciter signal is applied on line 5 to the RF solid state amplifier 10, whose output establishes an input RF drive level to the TWT 30. The power level of the RF exciter signal is typically in the milliwatt range, insufficient to effectively drive the TWT. Thus, a solid state RF amplifier such as the amplifier 10 is normally employed to provide a first stage of amplification, resulting in an RF input power level to the TWT in the watt range.

The output of the solid state amplifier 10 is coupled through variable attenuator 20 to the input of TWT amplifier 30. The output of the TWT 30 is passed through coupler device 40. The coupled output 40 is provided on line 41 to RF detector 42. The detector output is a video signal whose level is representative of the detected power level from coupler 40; this video signal is provided to the controller 50. The controller 50 in turn provides a control signal to the variable attenuator 20, controlling the attenuation setting, dependent on the frequency of the RF input signal. The frequency of the RF exciter signal is provided as a digital frequency code word on line 45 to controller 50.

The digital attenuator 20 sets the TWT input drive level. The setting of attenuator 20 is controlled by a six-bit control word, and in the preferred embodiment has an attenuation resolution of 0.25 dB per step with a 15 dB range of control.

The system has two modes of operation, the calibration mode and the normal mode. In the calibration mode, the system determines the attenuator setting to obtain an optimum RF input level resulting in the maximum TWT power output. The attenuator setting resulting in the optimum TWT output power for each frequency is stored in a non-volatile memory. In the normal mode, the controller 50 automatically sets the attenuator 20 to the calibrated setting for the present exciter frequency.

A change in frequency, initiated by the external RF exciter system, is communicated to the controller 50 via the digital frequency code word on line 45. Alternatively, the system may include other means for determining the exciter frequency.

The drive control system operates in the calibrate mode as a "closed-loop" controller to optimize the TWT RF input drive for any frequency applied to its input. This is accomplished by using a calibration algorithm to increase the RF input drive to the TWT from a minimum (underdrive) to the optimum setting resulting in the optimum TWT output power level for each exciter frequency by varying the attenuator 20. The controller 50 continues to vary the drive about this optimum value until a predetermined number of samples of the TWT output power have been taken, and the corresponding attenuator setting resulting in the optimum output power is determined and stored for use during the normal mode.

The resulting calibration values are stored in a nonvolatile memory, such as an electrically erasable programmable read only memory (EEPROM) comprising controller 50. In the normal mode, the attenuator 20 is set in accordance with the stored EEPROM value which corresponds to the present frequency, thus maintaining optimum RF drive across the entire frequency band of interest.

Figure 3:
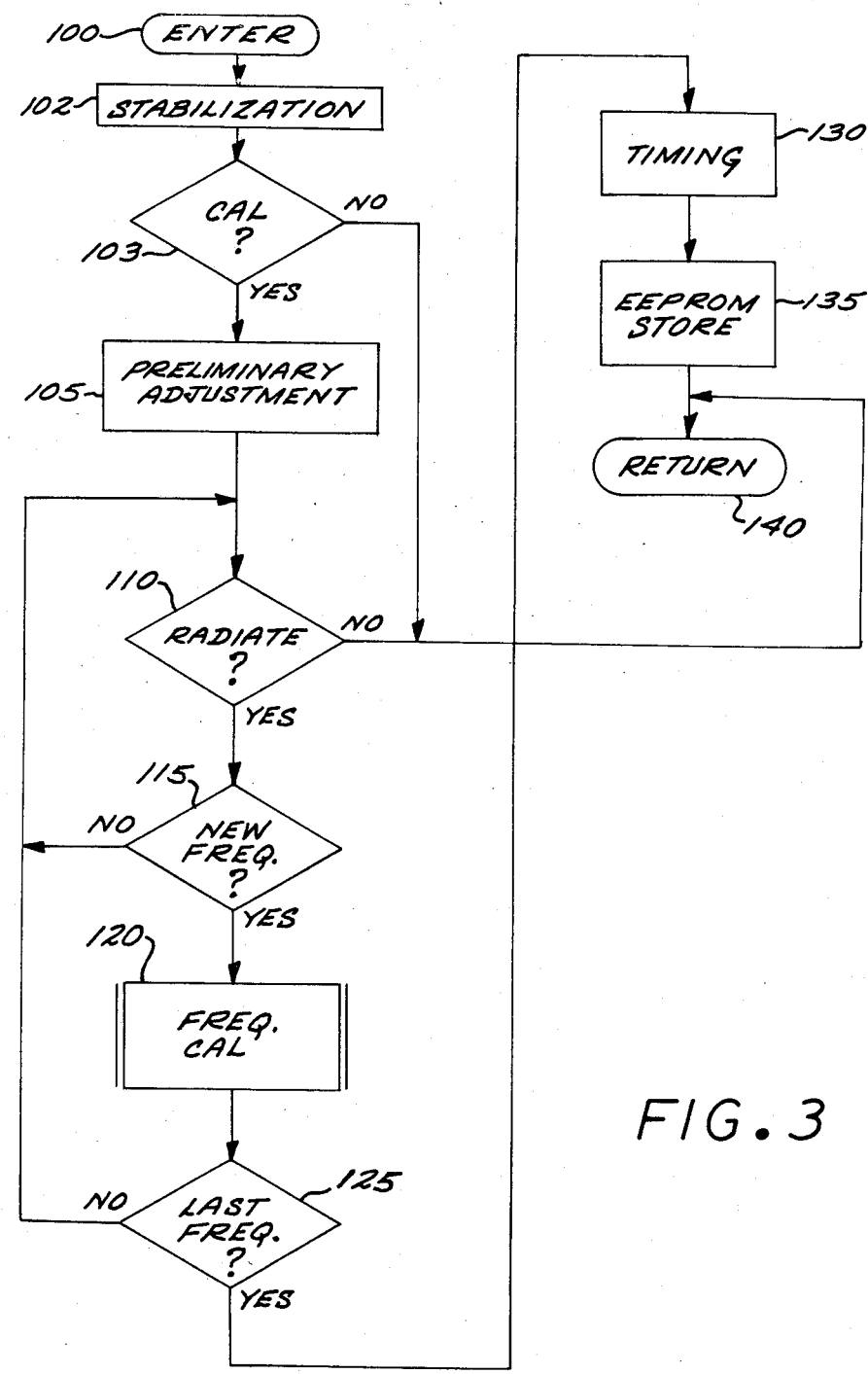
FIG. 3 is a flow chart illustrative of the RF calibration operation throughout a range of frequencies.

The general calibration algorithm is illustrated in the flow chart of FIG. 3. After a stablization delay to allow the TWT cathode current controller to stablize to the desired cathode current level, at step 103, the TWT system is checked to determine whether the system is in condition for calibration. For example, high voltage and cathode current must be applied to the TWT and the system TWT "radiate" command selected. If the calibration requirements are not met, the algorithm branches to return step 140, terminating the calibration process.

With the calibration requirements met at step 103, then at step 105, preliminary adjustments are made to the timing of the RF input drive pulses to the TWT as well as the timing of the TWT cathode current pulses. In the application of the preferred embodiment, the TWT amplifier is employed in a pulsed operation. Thus, to obtain TWT output power, the RF drive pulse and cathode current pulse should coincide. The preliminary timing adjustment conducted at step 105 substantially aligns the timing of the two pulses so that there will be TWT output power during the calibration mode.

In steps 110 and 115, the system "radiate" command and the frequency code word provided to the controller 50 are tested. If, at step 110, the radiate command is no longer selected the calibration mode is terminated; otherwise, RF drive calibration will be performed at each exciter frequency. Thus, at step 115 the frequency code word is tested to determine if the frequency has already been calibrated. If the frequency code has not changed from the frequency at which the previous calibration was performed, the algorithm branches back to step 110 in a delay loop, until the exciter frequency is changed to a new frequency not yet calibrated.

At step 120, the calibration for the optimum drive level for the selected frequency is performed. This step is described in more detail hereinbelow with respect to the flowchart of FIG. 4. At step 125, the frequency code word is tested to determine whether the calibration has been performed at all of the frequencies of interest in the frequency band. This may be done by comparing the number of exciter frequencies at which the calibration has been performed with the predetermined total number of frequencies to be calibrated. If this is not the last frequency, the algorithm branches back to step 110, and the loop is repeated from that point for another exciter frequency.

After calibration has been performed at all frequencies of interest, final adjustment of timing is performed at step 130 to align the cathode current and RF input pulses. The specific details by which the final timing adjustment is carried out per se are not considered essential to the practice of the present invention. The results of both drive level and timing calibrations are then transferred from the controller buffer memory to the EEPROM for storage at step 135. The calibration algorithm is exited at step 140.

Figure 4:
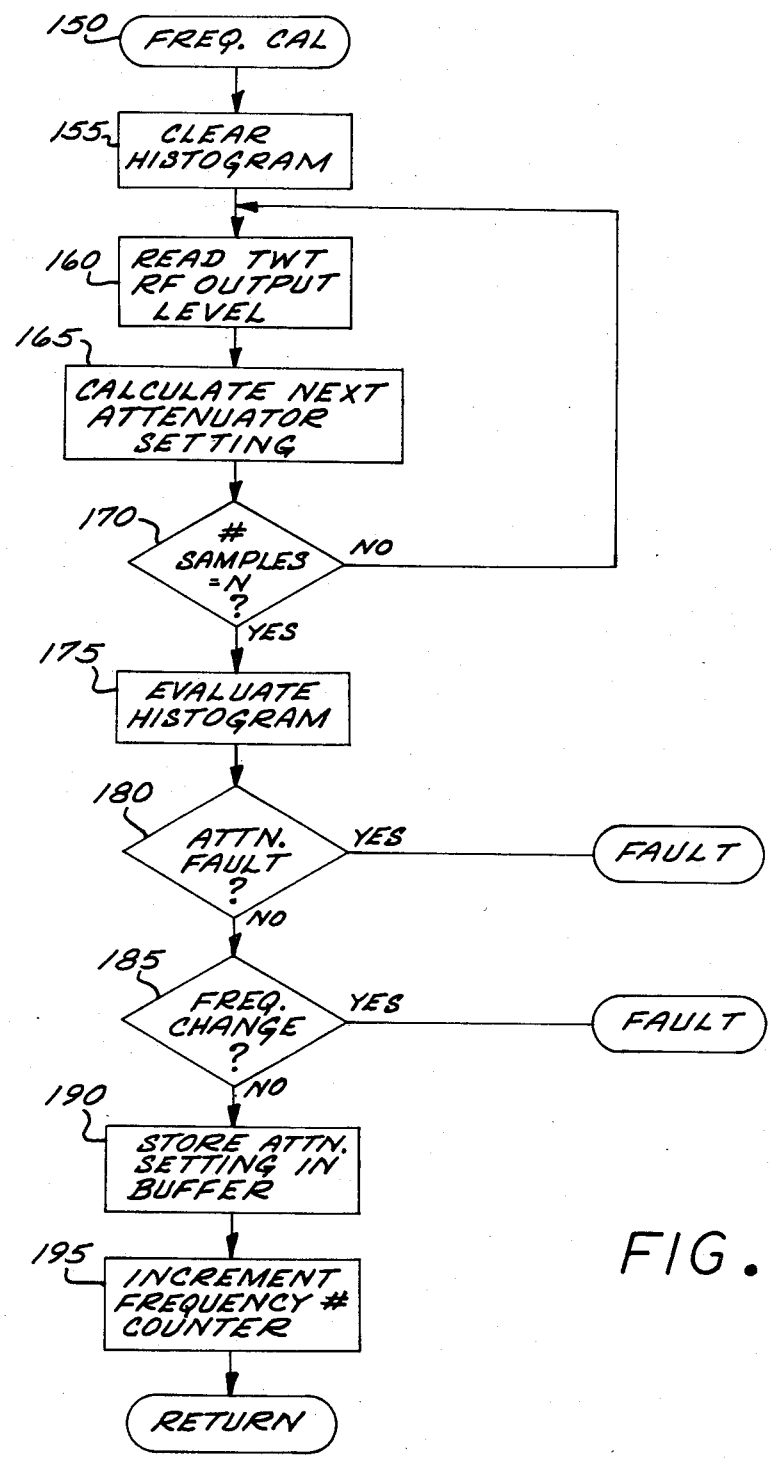
FIG. 4 is a flow chart of the calibration operation at an individual frequency.

FIG. 4 is a flowchart illustrating the sequence of operations for performing the input drive calibration at a single RF exciter frequency (step 120 of FIG. 3). The attenuator 20 employed in the preferred embodiment may be set to sixty-four different attenuation settings. The controller 50 is adapted to perform a separate counter function for the number of times each of the sixty-four possible attenuator settings is selected during the individual frequency calibration. These sixty-four "counters" are implemented from processor registers or memory locations which are incremented once for each TWT pulse, i. e., each time the attenuation setting is changed. It is well known to those skilled in the programming art how to program a computer such as a microprocessor to carry out such a counting function, and the details of such a program need not be described in further detail.

The contents of these registers or counters may be employed to develop a histogram of the various attenuator settings through the particular calibration cycle. Thus, the controller is adapted to perform a histogram function to generate a histogram of the attenuator settings.

At step 155 of the individual frequency calibration cycle, the individual attenuator setting counters are initialized, i.e., set to zero, and the attenuator is set to the maximum attenuation level. Once the histogram and attenuation setting have been initialized, the TWT output power is sampled at step 160. This sampled power value is used to calculate the next attenuator setting, at step 165. If the power value increased over the power value for the preceding attenuator setting, the attenuator is changed to the next lower impedance setting. Each time a particular attenuator setting is selected, the corresponding histogram counter is incremented.

At step 170, a decision is made as to whether the number of output power samples equals N. N is a number which is experimentally determined to be the smallest number of samples which will result in an accurate calibration. As the number of samples is increased, the height of the peak in the histogram increases, at the expense of lengthening the calibration time. For the application of the preferred embodiment, N is selected to be 255. Thus, at step 170, if the number of samples taken does not equal 255, the algorithm loops back to step 160. If the number of samples does equal N, the algorithm proceeds to step 175.

At step 175, the histogram developed by the counters for each attenuator setting is evaluated to find the counter with the highest value. FIGS. 5 and 6 illustrate the TWT output power sampling and the resultant histogram of attenuator settings which is evaluated to determine the optimal setting. In FIG. 5, the RF output power increased after each sample from times $t_0$ to $t_1$. This corresponds to increases in the RF drive level and the use of attenuator settings 1 through 16. From times $t_1$ to $t_2$, increases in drive with settings 17 and 18 (indicated by the parenthetical numbers (17), (18) in FIG. 5) also result in RF output power increases.

The algorithm which is employed in the preferred embodiment is adapted to change the attenuator setting by one bit if the difference between the output power samples (which have been digitized and read by the microprocessor,) before and after the change in attenuator setting is one bit or less. If the difference in power samples is two bits or more, then the attenuator setting is changed by two bits from its previous setting.

When the drive is increased by decreasing the attenuation to attenuator setting 19 at time $t_2$, a decrease in RF output power occurs. Since the RF output power decreased for an increase in drive level, the next drive level is decreased by the microprocessor by increasing the attenuation to setting 18. The calibration algorithm continues to resample output power levels about setting 18 to optimize the peak output power. At time $t_3$, the power level decreased by two units, resulting in a change in the attenuator setting of two bits, i.e., from setting 19 to 17. Thus, the attenuator setting sequence between times $t_1$ and $t_4$ is 17, 18, 19, 18, 17, 18, 19, 17, 18 updates the histogram counters, as illustrated in FIG. 6. The sampling and histogram updating continues until the number of power samples reaches N.

The algorithm employed in the preferred embodiment to calculate the attenuator setting at step 165 operates by comparing the previous power sample A with the current power sample B before changing the attenuator. If the value of A is less than B, the attenuator setting is reduced to reduce the attenuation, either by one bit or two, as discussed above. Once the peak of the saturation curve is passed, then power sample A will be greater than power sample B. At that point, the attenuator setting is increased to increase the attenuation level. These steps are repeated until the number of samples equals the predetermined number N.

Once the predetermined number of samples is determined to have been taken at step 170, the histogram is evaluated at step 175 to find the counter with the highest number. At step 180 this counter setting is evaluated to determine whether the highest counter value corresponds to one of the limits of the variable attenuator, i.e., the highest or lowest attenuation. If so, this triggers a fault indicating the attenuation range is not capable of optimizing the RF drive and the calibration mode is exited. At step 185, the frequency code is tested to verify that the same frequency was used throughout the calibration cycle. If the frequency did change, a fault is also declared.

At step 190, the attenuator setting determined in step 175 to be optimum is stored in the buffer memory associated with the microprocessor. In the illustration of FIGS. 5 and 6, evaluation of the histogram will locate the highest counter setting as 18. This setting results in maximum RF output power from the TWT. At step 195, the frequency counter, which keeps track of the number of frequencies for which the calibration has been perfomed, is incremented.

While the flowcharts illustrated in FIGS. 3 and 4 may be implemented in different ways, an exemplary listing of source code which has been employed with the preferred embodiment to carry out the invention is set forth in Appendix A.

Figure 7:
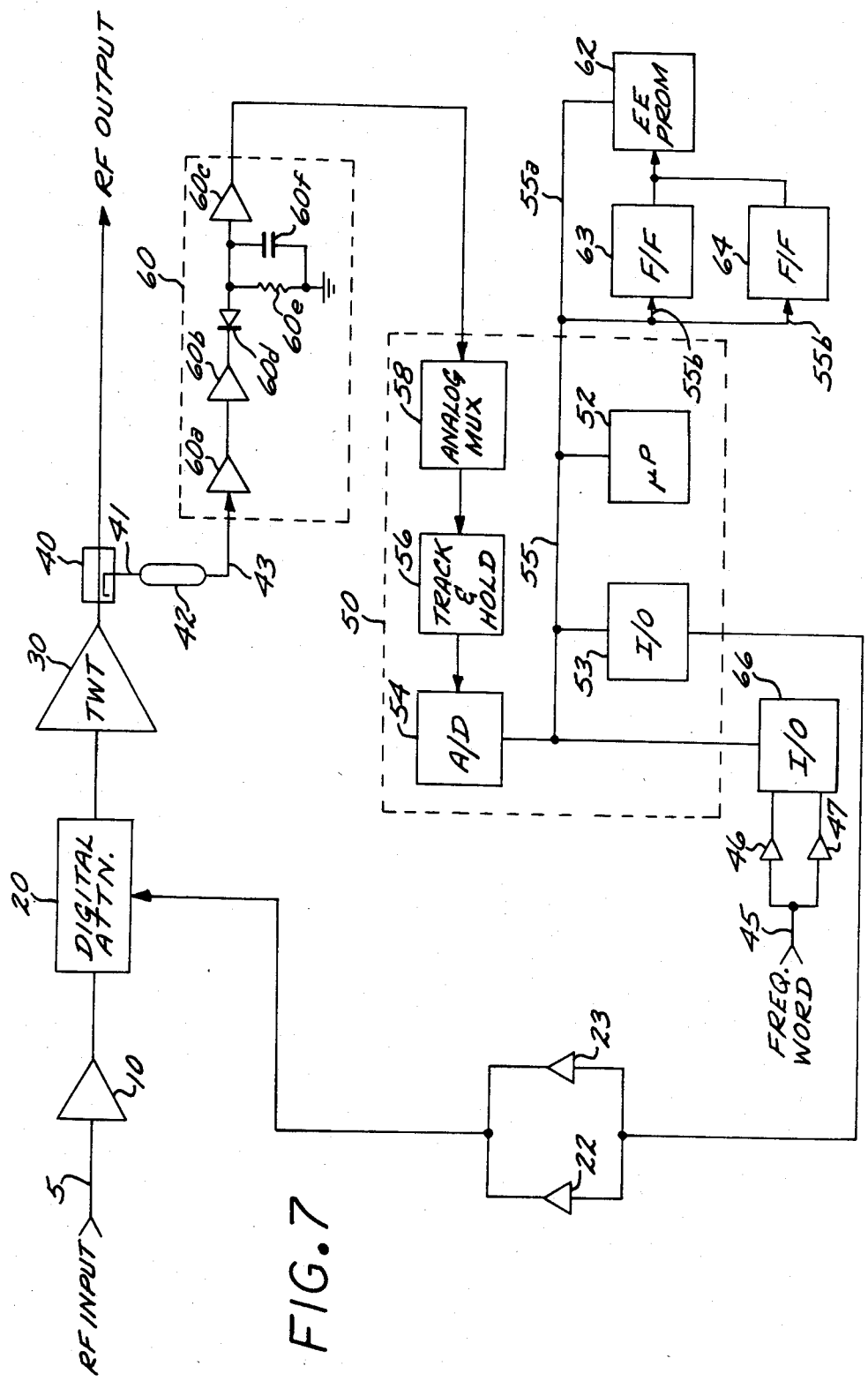
FIG.7 is a composite block diagram of the preferred embodiment.

Referring now to FIG. 7, the system comprising the preferred embodiment is illustrated in block diagram form. The RF exciter signal is provided on line 5 to RF solid state amplifier 10. The output of the amplifier 10 is passed through attenuator 20, and the attenuator output comprises the RF drive to the TWT 30. In the preferred embodiment, the attenuator 20 comprises a 6-bit digital attenuator such as that marketed by Hylectronics Corporation, Newton Road, Littleton, Mass., model PX8, having a 15 db range and a resolution of 0.25 db per step.

RF coupler 40 is connected to the TWT 30 output, and its coupled output 41 provides a small part of the RF energy from the TWT 30 to RF detector 42. The detector 42 provides a video signal on line 43 whose amplitude is representative of the relative power output of the TWT 30.

The detector signal is passed to signal conditioner 60, which performs amplification and peak detection functions. The signal conditioner 60 comprises video amplifier 60a; in the preferred embodiment, a Fairchild differential video amplifier, model $\mu$A733, is advantageously employed as the video amplifier. The amplified signal is provided to a peak sampler circuit, comprising operational amplifiers 60b and 60c, diode 60d, resistor 60e and capacitor 60f. These elements represent a simplified schematic of the peak sampler circuit. Such circuits are well-known, and are discussed, for example, in the book "Electronic Circuits and Applications," by Steven D. Senturia and Bruce D. Wedlock, (John Wiley, 1975), at pages 208-210. The function of the peak sampler is to charge the capacitor 60f to the peak voltage level, and then to hold the voltage for a predetermined time interval determined by the R-C time constant of resistor 60e and capacitor 60f.

Because the TWT amplifier of the preferred embodiment is operated in a pulsed mode, the detected video signal pulses on line 43 are very short. The signal conditioning circuit 60 provides a useful output signal level which may be provided to track-and-hold module 56 through multiplexer 58.

Multiplexer 58 provides the capability of selectively switching one analog signal from several possible input signals; only the analog signal from circuit 60 is shown. This allows one of several signals to be provided to the analog-to-digital converter (ADC) 54 for conversion to a digital signal, which is provided as an input to microprocessor 52. In the preferred embodiment, a Datel-Intersil analog multiplexer, model MV-1606M is employed as multiplexer 58.

The track-and-hold module 56 comprises a hybrid video track and hold device such as that marketed by the Data Device Corporation as model ADH-50. The module 56 is adapted to rapidly track and hold the peak video signal level, enabling the ADC 54 to properly carry out the conversion. The ADC marketed by Datel-Intersil, Inc., 11 Cabot Boulevard, Mansfield, Mass., as the model ADC-815 and the Intel Corporation microprocessor, model 8085, are employed in the preferred embodiment as ADC 54 and microprocessor 52, respectively.

An eight bit bus 55 allows digital signal communication among the output of ADC 54, the microprocessor 52, the non-volatile memory comprising EEPROM 62 and flip/flop devices 63 and 64, and input/output peripheral devices 53 and 66. In the preferred embodiment, the flip-flop devices 63 and 64 are 54LS174-type hex D flip-flops; the EEPROM 62 is a model X2212 device, marketed by XICOR. Inc., 851 Buckeye Court, Milpitas, Calif. The peripheral devices 53 and 66 comprise Intel model 8155 devices.

The microprocessor is adapted to read/write data over bus 55 to/from EEPROM 62. The flip-flops 63 and 64 interface between the microprocessor 52 and EEPROM 62 via busses 55a, 55b and 55c and are employed to verify that data was correctly programed into the EEPROM 62.

The 5-bit frequency word is provided on bus 45 to differential line receivers 46 and 47, which may be 26LS31 type devices, employed for noise isolation. The line receiver outputs are coupled to peripheral device 66, so as to be available to the microprocessor over data bus 55.

The peripheral device 53 is coupled to the digital attenuator 20 through line drivers 22, 23, which comprise 26LS33 type drivers in the preferred embodiment, to provide 6 differential bit pairs to the attenuator 20. The attenuator 20 further comprises a pair of corresponding line receivers (not shown) of the 26LS31 type. The line receivers and line drivers are employed in the preferred embodiment for noise isolation purposes, as the pulsed TWT amplifier is a high noise environment.

The analog output of device 56 is converted to a digital signal by ADC 54 and provided to an input port of microprocessor 52. Thus, the microprocessor 52 is able to monitor digital signals representative of the sampled RF output power level of the TWT.

The microprocessor 52 is coupled to EEPROM 62 to store and retrieve data, as described above. The output of the microprocessor 52 controls the attenuator setting through peripheral device 53 and line drivers 22, 23.

There has been described a novel system for optimizing the input drive to a TWT amplifier, which provides the capability for recalibration of the drive as the elements of the amplifier age. Another advantage of the system is that it is not dependent on measuring the actual RF input power level. In the disclosed embodiment of the invention, the input level is not monitored at all, and only relative changes in the output power are monitored by the system, which result from changes in the attenuation setting. Moreover, the actual attenuation introduced by the variable attenuator is not measured. Thus, the disclosed system does not depend on the accuracy of absolute attenuation or measured power levels. In a broad sense, the calibration mode may be viewed as an iterative process wherein an input drive parameter is varied to determine a calibrated drive parameter value which results in the optimum RF output power level for each frequency of interest. While the invention has been described in the context of a TWT amplifier, it is believed that the invention can be employed to optimize the input RF drive to any pass-through microwave amplifier.

It is understood that the above-described embodiment is merely illustrative of the present invention. Numerous and varied other arrangements may be devised in accordance with the principles of the invention by those skilled in the art without departing from the scope of the invention.

What is claimed is:

1. A method for optimizing the input RF drive level to a microwave amplifier over an input frequency bandwidth, comprising the steps of:
    providing a controllable means of varying the input drive level to the amplifier in response to control signals;
    providing a central controller for providing said control signals to said controllable means, the controller adapted for operation in a calibration mode and a normal amplifier operational mode;
    in said calibration mode, for each exciter frequency of interest, determining through an iterative process of varying an input drive parameter, the calibrated value of the input drive parameter which results in the maximum power output;
    in said normal amplifier operational mode, setting said input drive parameter value at the calibrated value corresponding to the present frequency;
    operating in the normal amplifier operational mode during periods of normal amplifier operation; and
    operating in the calibration mode during amplifier calibration periods.

2. The method of claim 1 wherein said calibration mode further comprises the step of storing in a memory device data representative of said calibrated value for each frequency of interest.

3. The method of claim 2 wherein said step of storing in a memory device data representative of said calibrated value for each frequency of interest further comprises storing said data in a nonvolatile memory device.

4. The method of claim 1 wherein said step of determining said calibrated parameter values comprises iteratively changing the attenuation level of a programmable attenuator adapted to selectively attenuate the input drive to the amplifier, and wherein said input drive parameter comprises the programmable attenuator setting.

5. The method of claim 4 wherein said iterative process comprises the steps of:
    (i) programming said attenuator to an initial setting;
    (ii) sampling the output;
    (iii) determining a new attenuator setting and programming the attenuator to the new setting; and
    (iv) repeating steps (ii) and (iii) until a predetermined number of samples have been taken.

6. The method of claim 5 wherein the step of determining a new attenuator setting comprises:
    (i) determining whether the previous change in the attenuator setting resulted in increased output power; and (ii) if so, decreasing the attenuator setting in the same direction as the previous attenuator setting change; or (iii) if not, increasing the attenuator setting in the opposite direction from the previous change.

7. The method of claim 6 wherein the step of determining the calibrated value of the attenuator setting comprises the step of counting the number of times each attenuator setting is used during said iterative process, and determining the calibrated value as that attenuator setting which received the maximum usage during said iterative process.

8. A system for optimizing the RF input drive to a traveling wave tube (TWT) amplifier over an exciter frequency bandwidth, comprising:
   programmable means for varying the input drive to the TWT amplifier in response to a drive signal;
   means for providing a frequency signal indicative of the exciter frequency; and
   controller means responsive to said frequency signal and adapted to provide said drive signal to said programmable means so as to adjust the input drive level of said TWT amplifier to a predetermined optimum level in dependence on the frequency of the exciter signal, whereby the input drive level to the TWT amplifier is set to the optimum level for each exciter frequency of interest.

9. The invention of claim 8 wherein said programmable means for varying the input drive to the TWT amplifier comprises a variable attenuator having a plurality of attenuation settings, and wherein the attenuation setting is determined by said drive signal.

10. The invention of claim 9 wherein said controller means is adapted to set the drive level by adjusting said attenuator to a predetermined attenuation setting resulting in the optimum TWT output level for the present TWT exciter frequency.

11. The invention of claim 8 further comprising sampling means for sampling the output of TWT amplifier and providing a sample signal to the controller representative of the output level.

12. The invention of claim 11 wherein the controller means is adapted for operation in a calibration mode for determining the calibrated attenuation setting for each exciter frequency, said controller being responsive to the sample signal and said frequency signal and adapted to progressively vary the attenuator through a plurality of attenuation settings while monitoring the TWT output level to determine the optimum attenuation setting.

13. The invention of claim 8 further comprising a memory means coupled to said controller, and wherein data representative of each of the predetermined drive signals corresponding to each TWT exciter frequency is stored during the calibration mode, and wherein said controller is adapted to retrieve said data in responsive to said frequency signal during the normal operating mode of the TWT amplifier.

14. The invention of claim 13 wherein said memory comprises a nonvolatile memory adapted to retain said data through period when power is not applied to the system.

15. A system for optimizing the RF input drive to a microwave amplifier, comprising;
   a programmable attenuator means for selectively attenuating the RF input drive to the amplifier;
   detector means for detecting the RF power output of the amplifier and providing a detector signal indicative of the output power level;
   means for providing frequency signals indicative of the frequency of the RF input drive to the amplifier; and
   controller means operable in a calibration mode and in a normal operating mode, said controller being responsive to said detector signals and said frequency signals during said calibration mode to determine a calibration attenuator setting for each frequency of interest, said controller being responsive to said frequency signal in said normal operating mode to program said attenuator to said calibrated attenuator setting corresponding to the value of said frequency signal.

16. The system of claim 15 further comprising memory means for storing data representative of said calibrated attenuator settings, and wherein said controller means is adapted to enter said data in said memory means during the calibration mode, and to retrieve data in dependence on the present frequency signal during the normal operating mode.

17. The system of claim 16 wherein said memory means comprises a nonvolatile memory device.

* * * * *